(12) United States Patent
Kondakova et al.

(10) Patent No.: US 8,242,489 B2
(45) Date of Patent: Aug. 14, 2012

(54) OLED WITH HIGH EFFICIENCY BLUE LIGHT-EMITTING LAYER

(75) Inventors: Marina E. Kondakova, Kendall, NY (US); Ralph H. Young, Rochester, NY (US)

(73) Assignee: Global OLED Technology, LLC., Seoul (KR)

( * ) Notice: Subject to any disclaimer, the term of this patent is extended or adjusted under 35 U.S.C. 154(b) by 292 days.

(21) Appl. No.: 12/640,100

(22) Filed: Dec. 17, 2009

(65) Prior Publication Data

US 2011/0147716 A1    Jun. 23, 2011

(51) Int. Cl.
*H01L 29/08*    (2006.01)

(52) U.S. Cl. ............... 257/40; 257/E51.028; 313/504; 428/690; 438/99

(58) Field of Classification Search ............ 257/40, 257/E51.001–E51.052; 313/504; 428/690; 438/99
See application file for complete search history.

(56) References Cited

U.S. PATENT DOCUMENTS

| | | | |
|---|---|---|---|
| 5,121,029 A | | 6/1992 | Hosokawa et al. |
| 5,294,870 A | | 3/1994 | Tang et al. |
| 5,552,678 A | | 9/1996 | Tang et al. |
| 5,688,551 A | | 11/1997 | Littman et al. |
| 5,703,436 A | | 12/1997 | Forrest et al. |
| 5,709,959 A | * | 1/1998 | Adachi et al. ............. 428/690 |
| 5,851,709 A | | 12/1998 | Grande et al. |
| 5,935,721 A | | 8/1999 | Shi et al. |
| 6,066,357 A | | 5/2000 | Tang et al. |
| 6,337,492 B1 | | 1/2002 | Jones et al. |
| 6,387,546 B1 | | 5/2002 | Hamada et al. |
| 6,534,199 B1 | | 3/2003 | Hosokawa et al. |
| 6,713,192 B2 | | 3/2004 | Fukuoka et al. |
| 6,936,961 B2 | | 8/2005 | Liao et al. |
| 7,018,723 B2 | | 3/2006 | Thompson et al. |
| 7,045,952 B2 | | 5/2006 | Lu |
| 7,074,500 B2 | | 7/2006 | Pfeifer et al. |
| 7,128,982 B2 | | 10/2006 | Oshiyama et al. |
| 7,132,174 B2 | | 11/2006 | Wang et al. |
| 7,252,893 B2 | | 8/2007 | Ricks et al. |
| 7,351,999 B2 | * | 4/2008 | Li ................................ 257/40 |
| 7,504,526 B2 | | 3/2009 | Kubota et al. |
| 7,544,425 B2 | | 6/2009 | Helber et al. |
| 2002/0055015 A1 | * | 5/2002 | Sato et al. .................. 428/690 |
| 2002/0197511 A1 | | 12/2002 | D'Andrade et al. |
| 2003/0068528 A1 | | 4/2003 | Thompson et al. |
| 2003/0175553 A1 | | 9/2003 | Thompson et al. |

(Continued)

OTHER PUBLICATIONS

Effects of interlayers of phosphorescent blue organic light-emitting diodes, Jonghee Lee, et al, Applied Physics Letters 92, 203305 (2008).

(Continued)

*Primary Examiner* — Kiesha Bryant
*Assistant Examiner* — Mark Tornow
(74) *Attorney, Agent, or Firm* — McKenna, Long, and Aldridge, L.L.P.

(57) ABSTRACT

The invention provides an OLED device comprising an anode, a cathode and a light-emitting layer located therebetween, said light-emitting layer comprising an anthracene host and a styrylamine blue light-emitting compound; and, located between the said light-emitting layer and the cathode, a first electron-transporting layer that is greater than 0.5 nm and less than 5 nm thick; and a second electron-transporting layer consisting essentially of an anthracene located between the first electron-transporting layer and the cathode. The first electron-transporting layer includes a compound with a less negative LUMO level than the anthracene in the second electron-transporting layer. Devices of the invention provide improvement in features such as efficiency.

17 Claims, 1 Drawing Sheet

U.S. PATENT DOCUMENTS

| | | | |
|---|---|---|---|
| 2005/0019604 A1* | 1/2005 | Thompson et al. | 428/690 |
| 2006/0158105 A1 | 7/2006 | Kim et al. | |
| 2006/0246315 A1 | 11/2006 | Begley et al. | |
| 2006/0251923 A1 | 11/2006 | Lin et al. | |
| 2007/0075631 A1 | 4/2007 | Tung et al. | |
| 2007/0252522 A1* | 11/2007 | Kondakov et al. | 313/506 |
| 2008/0284319 A1 | 11/2008 | Lee et al. | |
| 2009/0146552 A1 | 6/2009 | Spindler et al. | |
| 2009/0206736 A1 | 8/2009 | Kuma et al. | |
| 2009/0206743 A1 | 8/2009 | Oda et al. | |
| 2010/0219748 A1 | 9/2010 | Kondakova et al. | |
| 2010/0243992 A1* | 9/2010 | Tsuji et al. | 257/40 |
| 2011/0180792 A1* | 7/2011 | Lee et al. | 257/40 |
| 2011/0248250 A1* | 10/2011 | D'Andrade et al. | 257/40 |

OTHER PUBLICATIONS

Lee, Meng-Ting et al., "Stable styrylamine-doped blue organic electroluminescent device based on 2-methyl-9, 10-*di*(2-naphthyl)Anthracene." Applied Physics Letters, Oct. 2004, vol. 85, Issue 15, pp. 3301-3303.

* cited by examiner

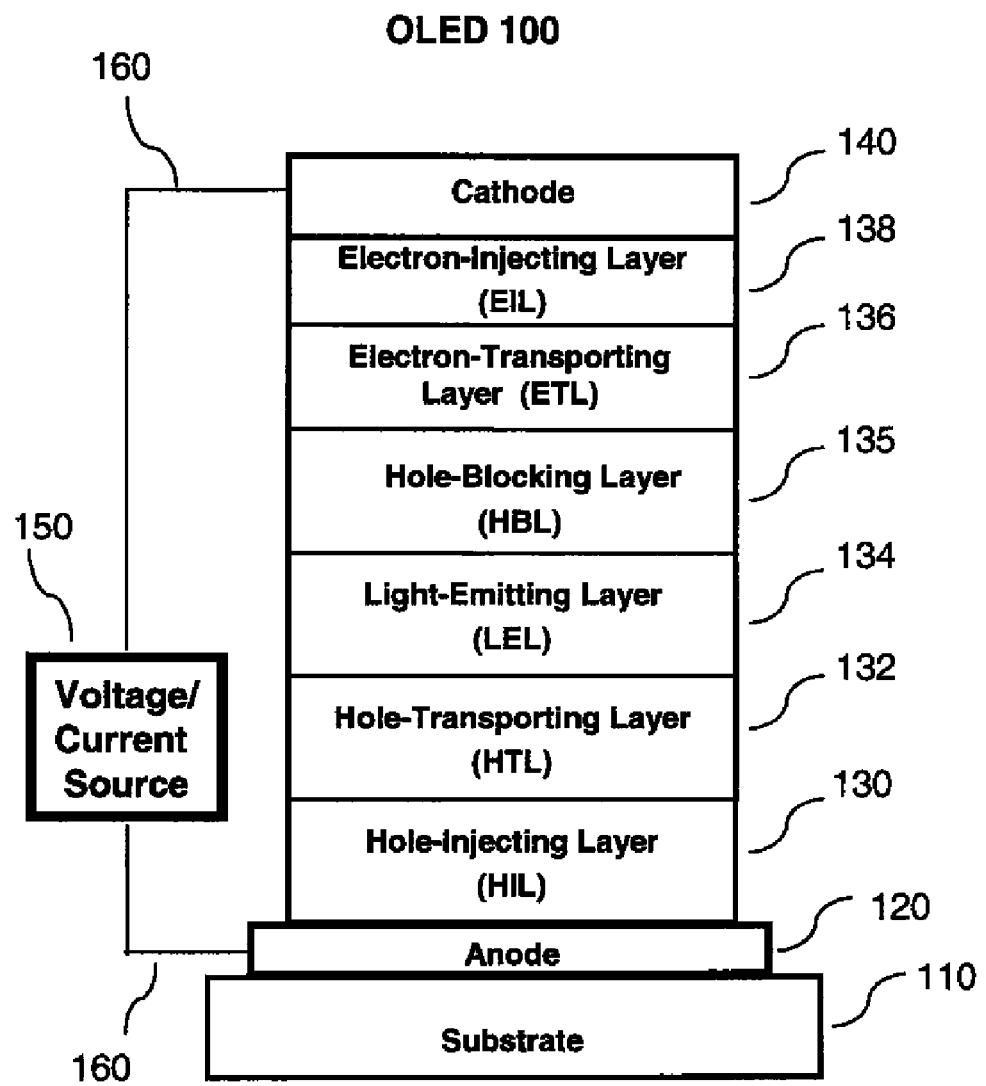

OLED WITH HIGH EFFICIENCY BLUE LIGHT-EMITTING LAYER

FIELD OF THE INVENTION

This invention relates to an electroluminescent device, more specifically, an organic light-emitting diode (OLED) device having a light-emitting layer containing a blue light-emitting styrylamine compound and an anthracene host; a thin first electron-transporting layer; and a second electron-transporting layer consisting essentially of an anthracene. The first electron-transporting layer contains a compound with a LUMO level less negative than the LUMO level of the anthracene of the second electron-transporting layer.

BACKGROUND OF THE INVENTION

While organic electroluminescent (EL) devices have been known for over two decades, their performance limitations have represented a barrier to many desirable applications. In their simplest forms, organic light-emitting diodes (OLEDs), also referred to as organic electroluminescent devices, contain spaced electrodes separated by an organic light-emitting structure which emits light in response to the application of an electrical potential difference across the electrodes. At least one of the electrodes is light-transmissive, and the organic light-emitting structure can have multiple layers of organic thin films which provide for hole injection and transport from an anode, and for electron injection and transport from a cathode, respectively, with light emission resulting from electron-hole recombination at or near the internal junction formed at the interface between the hole-transporting and the electron-transporting thin films.

The range of EL devices in recent years has expanded to include not only single color emitting devices, such as red, green and blue, but also devices that emit white light. Efficient white light producing OLED devices are highly desirable in the industry and are considered as a low cost alternative for several applications such as paper-thin light sources, backlights in LCD displays, automotive dome lights, and office lighting. White light producing OLED devices should be bright, efficient, and generally have Commission Internationale de l'Eclairage (CIE) 1931 chromaticity coordinates of about (0.33, 0.33). In any event, in accordance with this disclosure, white light is that light which is perceived by a user as having a white color. Typical color combinations that produce white light are red, green and blue; blue-green and orange; blue and yellow; but others are known.

Notwithstanding this development there are continuing needs for organic EL device components, such as blue light emitting layers, that will provide even higher luminance efficiencies while maintaining low device drive voltages and long lifetimes combined with high color purity. Such improvements in blue light emitting layers are particularly beneficial for white-light-producing OLEDs since blue light emitters tend to have lower efficiencies than emitters of other colors, so that in order to produce balanced whites, the blue pixel (in a RGB OLED device) may need to be driven at higher current densities, resulting in increased power consumption as well as shortened blue lifetimes, and the color-complementary layer(s) (in a white OLED) may need to operate at less than their maximum potential efficiency.

Styrylamines (for example, see U.S. Pat. No. 5,121,029 and U.S. Pat. No. 7,544,425) are well known emitters of blue light. Anthracenes are well known as electron-transporting materials (for example, see U.S. Pat. No. 6,387,546) useful as hosts in light-emitting layers (for example, see U.S. Pat. No. 5,935,721) including those with styrylamine emitters (for examples, see U.S. Pat. No. 6,534,199, U.S. Pat. No. 7,252,893, U.S. Pat. No. 7,504,526 and U.S. Pat. No. 6,713,192).

US Patent Publication 2007/0252522 discloses OLED devices with a blue light-emitting layer (LEL) with a styrylamine emitter and an anthracene host where the electron-transporting layer (ETL), which is located in contact with the LEL, consists of an anthracene.

U.S. Pat. No. 7,074,500, US Patent Publications 2002/0197511 and US 2006/0251923 all disclose OLEDs with a thin electron-blocking layer between the LEL and the ETL. US Patent Publication 2007/0075631 discloses OLEDs with a thin electron-impeding layer between the LEL, which is preferably phosphorescent, and the ETL, where the materials in the thin layer can be hole-transporting and have a LUMO level that is less negative than the LUMO levels of the ETL and the host in the LEL. US Patent Publications 2003/0175553 and US 2003/0068528 both show the use of Ir(ppy)$_3$ as a thin hole-blocking layer on the cathode side of a LEL.

U.S. Pat. No. 7,018,723 discloses OLEDs with ETLs that contain naphthalene and benzene derivatives. Lee et al., Applied Physics Letters, 92(20), 203305/1-3 (2008) discloses OLEDs with ETLs that contain silylated benzene derivatives.

However, these devices do not necessarily have all desired EL characteristics in terms of high luminance, low drive voltage, and sufficient operational stability. Notwithstanding all these developments, there remains a need to improve efficiency of blue light-emitting layers in OLED devices, as well as to provide embodiments with other improved features.

SUMMARY OF THE INVENTION

The invention provides an OLED device comprising an anode, a cathode and a light-emitting layer located therebetween, said light-emitting layer comprising an anthracene host and a styrylamine blue light-emitting compound; and located between the said light-emitting layer and the cathode, a first electron-transporting layer that is greater than 0.5 nm and less than 5 nm thick, and a second electron-transporting layer consisting essentially of an anthracene, located between the first electron-transporting layer and the cathode. The first electron-transporting layer includes a compound with a less negative LUMO level than the LUMO level of the anthracene in the second electron-transporting layer.

Devices of the invention provide improved features such as increased efficiency while maintaining sufficient operational stability and excellent color characteristics.

BRIEF DESCRIPTION OF THE DRAWINGS

FIG. 1 shows a schematic cross-sectional view of one embodiment of an inventive OLED device. It will be understood that FIG. 1 is not to scale since the individual layers are too thin and the thickness differences of various layers are too great to permit depiction to scale.

DETAILED DESCRIPTION OF THE INVENTION

The invention is generally as described above. An OLED device of the invention is a multilayer electroluminescent device comprising a cathode, an anode, light-emitting layer(s) (LEL), electron-transporting layers (ETLs) and optionally additional layers such as electron-injecting layer(s) (EIL), hole-injecting layer(s) (HIL), hole-transporting layer(s) (HTL), exciton-blocking layer(s), spacer layer(s), connecting layer(s) and hole-blocking layer(s).

The LEL of the invention is a blue light-emitting layer. This means that at least 80% of the light emitted from this layer is blue light which has a wavelength less than 500 nm. The thickness of the blue LEL is not critical, but generally between 0.5 and 50 nm, desirably between 10 and 35 nm.

The blue light-emitting layer of the invention comprises a host material and a blue light-emitting material. The majority host material is an anthracene. As used in the invention, the host material is non-emitting; that is, produces no significant (less than 10% of the total) proportion of the light emitted by that layer. Suitably, only a single anthracene host material is used in the light-emitting layer although there can be other non-emitting materials present in the host composition, including other anthracenes. However, the anthracene(s) should be the predominant host material(s) and present in greater percentage by volume than the other host materials.

The anthracene host of the invention is according to Formula (I).

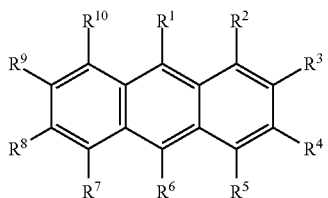

(I)

In Formula (I), $R^1$ and $R^6$ each independently represent an aryl group having 6-24 carbon atoms such as a phenyl group or a naphthyl group. $R^2$-$R^5$ and $R^7$-$R^{10}$ are each independently chosen from hydrogen, alkyl groups of 1-24 carbon atoms or aromatic groups (including heterocyclic aromatic groups) of 5-24 carbon atoms.

In one suitable embodiment $R^1$ and $R^6$ each represent an independently selected phenyl group, biphenyl group, or naphthyl group. It is preferred that at least one of $R^1$ and $R^6$ is naphthyl and most preferred that both are naphthyl. In preferred embodiments, $R^3$ represents hydrogen or an aromatic group of 6-24 carbon atoms and $R^2$, $R^4$, $R^5$, $R^7$-$R^{10}$ represent hydrogen. A particularly preferred anthracene is one where both $R^1$ and $R^6$ are naphthyl, $R^3$ is aryl and $R^2$, $R^4$, $R^5$, $R^7$-$R^{10}$ represent hydrogen.

Illustrative examples of useful anthracenes are listed below.

A-1

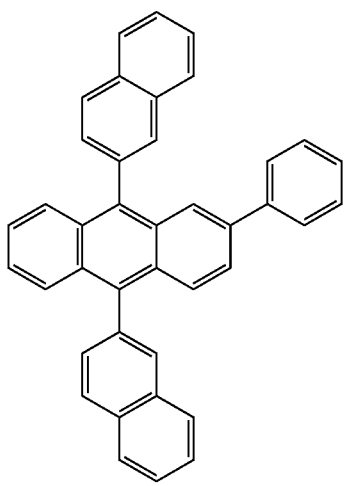

A-2

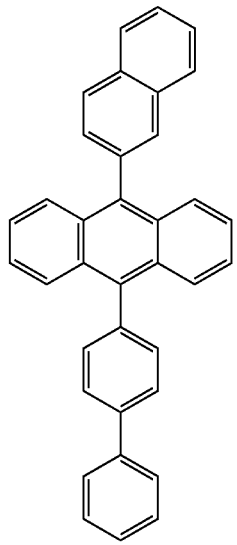

A-3

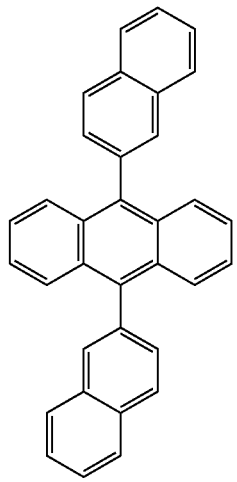

A-4

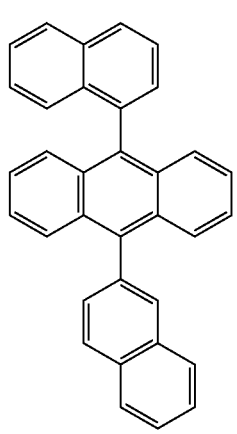

-continued

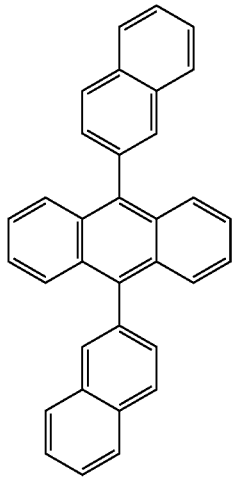

A-5

The blue light-emitting layer of the invention also contains a styrylamine as a blue light-emitting compound. Desirably, the styrylamine should be the predominating light-emitting material in that layer. By predominating, it is meant that at least 90% of the total amount of light emitted by this layer is produced by the compound; preferably, it should be the only detectable light-emitter in this layer. The styrylamine is present at 0.1% to 20% by volume of the LEL, desirably from 1% to 10%.

Preferred styrylamines are according to Formula (II):

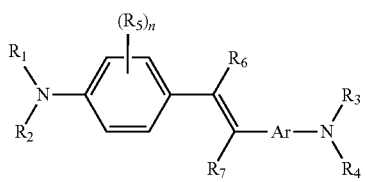

(II)

wherein:

$R_1$, $R_2$, $R_3$ and $R_4$ are independently chosen aryl groups of 6-24 nucleus carbon atoms with the proviso that $R_1$ and $R_2$ or $R_3$ and $R_4$ can be joined together to form a ring; or alkyl groups of 1-6 carbon atoms;

$R_5$ is selected from alkyl and aryl groups;

n is 0-4;

$R_6$ and $R_7$ are independently selected from hydrogen, alkyl or aryl groups; and Ar represents a substituted or unsubstituted aryl group of 6 to 30 nucleus carbon atoms.

It should be noted that it is possible that $R_1$ or $R_2$ (or both) can also be connected with $R_5$ to form a ring system or that $R_3$ or $R_4$ (or both) can be connected with Ar to form a ring system.

More preferred styrylamines are those in which $R_1$, $R_2$, $R_3$ and $R_4$ are substituted or unsubstituted phenyl or naphthyl groups or where ($R_1$ and $R_2$) or ($R_3$ and $R_4$) are joined together to form a carbazole group. One desirable example of a substituted phenyl for $R_1$, $R_2$, $R_3$ and $R_4$ is p-methylphenyl (p-tolyl). $R_5$ can be alkyl of 1-10 carbon atoms (for example, t-butyl) or aryl groups of 6-20 nucleus carbon atoms. Adjacent $R_5$ substituents can also be combined to form an additional fused ring system. However, it is preferred that n is 0. While $R_6$ and $R_7$ can be the same alkyl or aryl groups as defined for $R_5$, it is preferred that both are hydrogen. Preferred Ar groups are substituted or unsubstituted phenyl, biphenyl, styryl or naphthyl. Preferred substituents for Ar include styryl and phenyl.

Most preferred as Ar is a biphenyl group according to Formula (IIa):

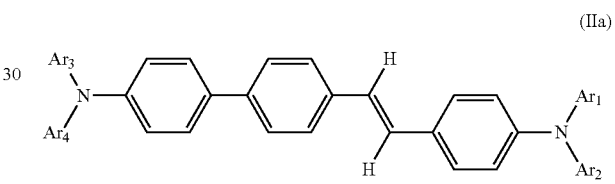

(IIa)

wherein:

$Ar_1$-$Ar_4$ are each independently an aryl group of 6 to 24 nucleus carbon atoms where $Ar_1$-$Ar_2$ and $Ar_3$-$Ar_4$ can be optionally joined together to form a ring system.

Some examples of suitable $Ar_1$-$Ar_4$ groups are phenyl, naphthyl, anthracenyl, fluoranthenyl, pyrenyl, and phenanthryl. $Ar_1$ and $Ar_2$ or $Ar_3$ and $Ar_4$ can be joined to form a carbazole group. Preferably, $Ar_1$-$Ar_4$ groups are each individually unsubstituted phenyl or alkyl substituted phenyl. Methyl groups are particularly preferred alkyl substituents for when $Ar_1$-$Ar_4$ are alkyl substituted phenyl.

Some illustrative examples of styrylamine compounds according to Formula (II) are:

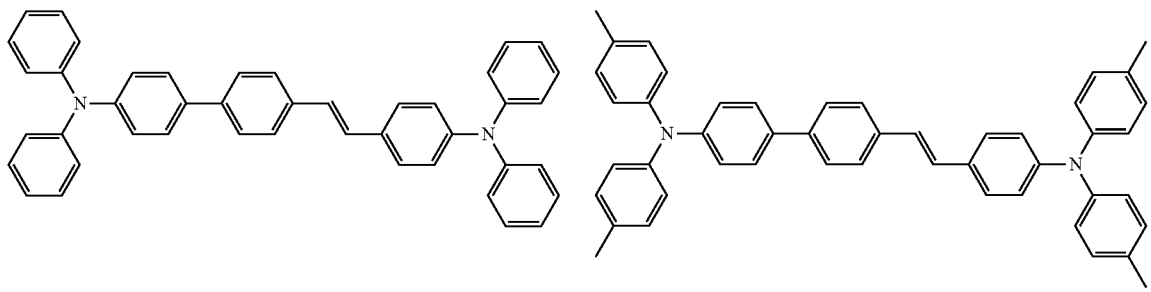

S-1　　　　　　　　　　　　　　　　　　S-2

-continued

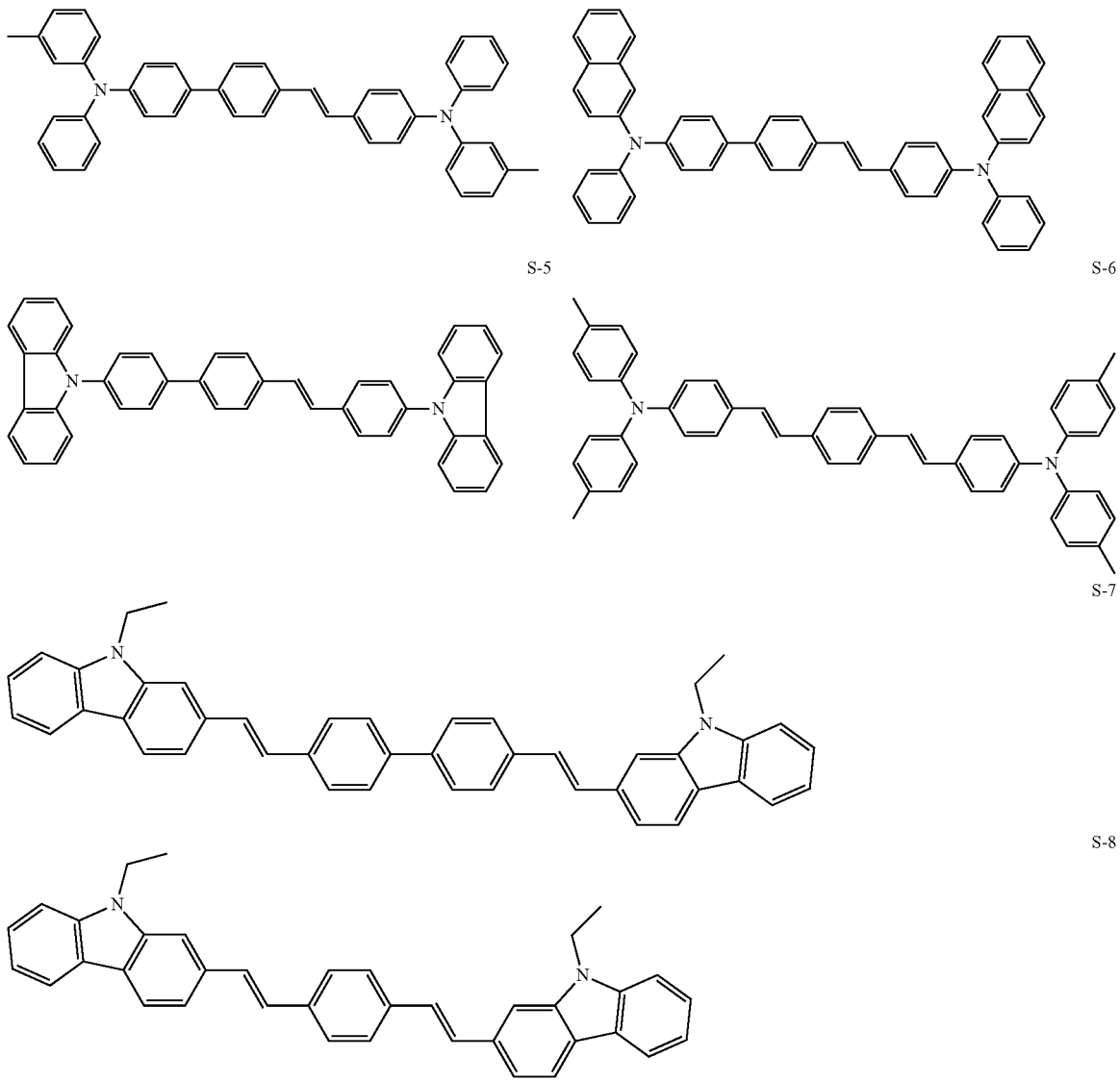

OLEDs of the invention have a thin first ETL (denoted ETL1) located between the blue LEL and the cathode along with a second ETL (denoted ETL2) consisting essentially of an electron-transporting anthracene derivative that is located between the ETL1 and the cathode. Anthracene ETLs have many desirable properties, but when used in contact with a blue LEL that has an anthracene host, the efficiency can be less than optimal.

In the present invention, the ETL1 contains a compound with a LUMO energy that is higher (less negative) than the LUMO energy of the anthracene used in the ETL2. The terms LUMO level, LUMO value and LUMO energy are used synonymously herein. Without being restricted to the following theory, it is believed that this difference in LUMO energies results in a bather for injection of electrons from the ETL2 into the ETL1, which causes a change in the electric field profile in the light-emitting layer. As a consequence, it is further believed that the recombination zone shifts away from the HTL/LEL interface towards the cathode side of the LEL or broadens towards the cathode side of the LEL. It is yet further believed that the shift or broadening of the recombination zone is responsible for the improved efficiency of the inventive devices, although the detailed mechanism of the improvement is not understood.

In order to reduce voltage increase due to the presence of a barrier to electron injection and an additional layer between the ETL2 and the LEL, this additional layer must be thin. Therefore, the ETL1 should be less than 5 nm thick. However, it cannot be so thin as to be ineffective as a bather. Thus, the ETL1 should be more than 0.5 nm thick. Preferably, the ETL1 should be between 1 and 4 nm thick and ideally between 2 and 3 nm thick.

In a first embodiment, the ETL1 is located between and in contact with both the blue LEL on one side (towards the anode) and the ETL2 on the other side (towards the cathode). This arrangement corresponds to the specific partial structure of anode/ . . . /blue LEL/ETL1/ETL2/ . . . /cathode. In this embodiment, there can be additional layers between the ETL2 and the cathode such as additional ETL(s) and electron-injection layers.

In this first embodiment, there can be more than one component in the ETL1, although the material with the higher (less negative) LUMO should be present at 50% or more, or even more desirably 90% or more, by volume of all materials in the layer. Preferably, the additional component(s) should be an anthracene at 10% by volume or less. Suitable anthracenes for this usage are the same as those used as hosts in the LEL according to Formula (I) and can be the same or different from the anthracene host in the LEL or the anthracene in the ETL2.

In a second embodiment, the ETL1 is not directly adjacent to the blue LEL but is separated from it by an additional layer consisting essentially of an anthracene. This layer is believed to serve primarily to transport electrons and will be denoted ETL3. Suitable anthracenes for this usage are the same as those used as hosts in the LEL according to Formula (I). Desirably, the anthracene in the ETL3 is identical to that used in the ETL2. The ETL1 should be between and in contact with both the ETL3 and the ETL2. This corresponds to the specific partial structure of anode/ . . . /blue LEL/ETL3/ETL1/ETL2/ . . . /cathode. The total thickness of the ETL3/ETL1/ETL2 unit can be in the range of 1-50 nm, preferably between 5 and 30 nm. Although the thickness of ETL2 and ETL3 can be the same, it is not required, and the relative thickness of both can be varied to optimize performance.

Suitable materials for use in the ETL1, having a LUMO level higher (less negative) than the LUMO level of the anthracene used in the ETL2 are derivatives of benzene and naphthalene as well as organometallic compounds of iridium. The difference between the LUMO levels of the material in the ETL1 and the anthracene in the ETL2 is indicative of the energy barrier for electron injection and provides the benefits of the invention. Preferably, the difference in LUMO levels should be at least 0.26 eV or, more preferably, it should exceed 0.35 eV.

The LUMO level (energy) for any compound can often be experimentally determined using well-known techniques (see, for examples, U.S. Pat. No. 7,132,174 B2, U.S. Pat. No. 7,128,982 B2, US Patent Publication 2006/0246315 or U.S. Pat. No. 7,045,952 B2) or can be calculated from theory. If possible, the HOMO (highest occupied molecular orbital) and LUMO (lowest unoccupied molecular orbital) energies of a compound should be experimentally determined for this invention. Experimentally determined LUMO energy data shown in the Table A for specific compounds were evaluated by the cyclic voltammetry method. Each LUMO energy was evaluated by adding 4.8 eV to the reduction potential vs. s.c.e. (saturated calomel electrode) using a solvent mixture of acetonitrile and toluene (50%/50% v/v, i.e., 1:1 acetonitrile/toluene by volume) containing 0.1M TBAF (tetrabutylammonium tetrafluoroborate) as the supporting electrolyte.

However, if the energies are unavailable or cannot be measured, theoretically calculated values can be used. HOMO and LUMO energies for a molecule can be derived from the orbital energies of Density Functional Theory calculations (here termed "raw" orbital energies). These raw HOMO and LUMO orbital energies ($E_{Hraw}$ and $E_{Lraw}$ respectively) are modified using an empirically derived linear correlation whose parameters were obtained previously by comparing the computed raw energies of various molecules to experimental energies obtained from electrochemical data. The HOMO and LUMO energies are given by this correlation according to equations 1 and 2:

$$HOMO=0.643*(E_{Hraw})-2.13 \qquad \text{(eq. 1)}$$

$$LUMO=0.827*(E_{Lraw})-1.09 \qquad \text{(eq. 2)}$$

$E_{Hraw}$ is the raw energy of the HOMO, and $E_{Lraw}$ is the raw energy of the LUMO, and all quantities are expressed in electron volts (eV). Values of $E_{Hraw}$ and $E_{Lraw}$ are obtained using the B3βYP method as implemented in the Gaussian 98 (Gaussian, Inc., Pittsburgh, Pa.) computer program. The basis set for use with the B3βYP method is defined as follows: MIDI! for all atoms for which MIDI! is defined, 6-31β* for all atoms defined in 6-31β* but not in MIDI!, and either the LACV3β or the LANL2βZ basis set and pseudopotential for atoms not defined in MIDI! or 6-31β*, with LACV3β being the preferred method. For any remaining atoms, any published basis set and pseudopotential can be used. MIDI!, 6-31β* and LANL2βZ are used as implemented in the Gaussian98 computer code and LACV3β is used as implemented in the Jaguar 4.1 (Schrodinger, Inc., Portland Oreg.) computer code. For polymeric or oligomeric materials, it is sufficient to compute $E_{Hraw}$ and $E_{Lraw}$ over a monomer or oligomer of sufficient size so that additional units do not substantially change the values of $E_{Hraw}$ and $E_{Lraw}$. It should be noted that the calculated energy values can typically show some deviation from the experimental values. Because the molecular orbital energies cannot be either calculated or measured accurately in some situations, LUMO energies differing by less than 0.05 should be considered equal for the purposes of this invention. The calculated LUMO energies are also shown in Table A. The experimentally determined values generally agree well with the calculated numbers. As stated above, the LUMO values for the materials of the invention should be experimentally determined and calculated LUMO values should be used only when it is not possible to experimentally determine the LUMO values. In any case, experimental values should be compared only to other experimental values and calculated values compared only to calculated values.

One class of suitable materials for the ETL1 is benzene derivatives according to Formula (III):

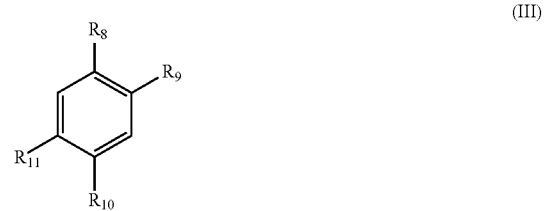

(III)

wherein at least two of $R_8$-$R_{11}$ both represent hydrogen or substituted carbon, silicon or nitrogen atoms with the proviso that no more than two of $R_8$-$R_{11}$ are hydrogen.

When at least two of $R_8$-$R_{11}$ in Formula (III) both represent substituted silicon or nitrogen atoms, then the preferred benzene derivatives are those where $R_8$ and $R_{11}$ are both hydrogen as shown in Formula (IIIa):

(IIIa)

where $R_{9'}$ and $R_{10'}$ are both tri-substituted silicon atoms or both di-substituted nitrogen atoms. While $R_{9'}$ and $R_{10'}$ can be different, it is preferred that they are identical. Suitable examples of tri-substituted silicon atoms are triphenylsilyl, tri-t-butylsilyl and diphenylnaphthylsilyl. Suitable examples of di-substituted nitrogen atoms are diphenylamino, di(p-methylphenyl)amino, N-phenyl-N-1-naphthylamino and heterocycles like carbazolyl.

Some illustrative examples of compounds according to Formula (IIIa) are:

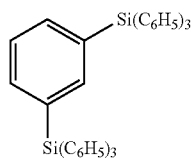

B-1

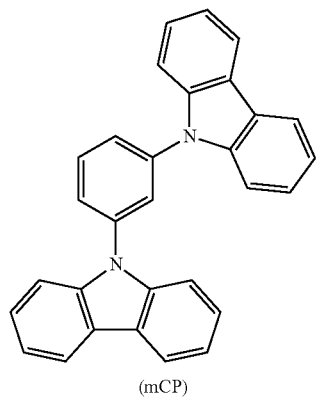

(mCP)

B-2

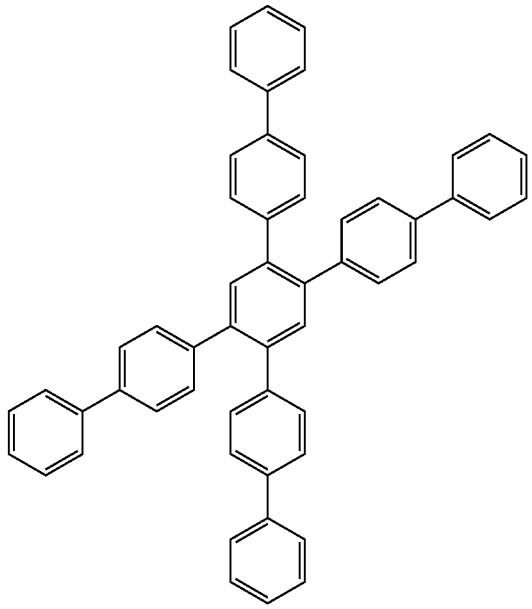

B-3

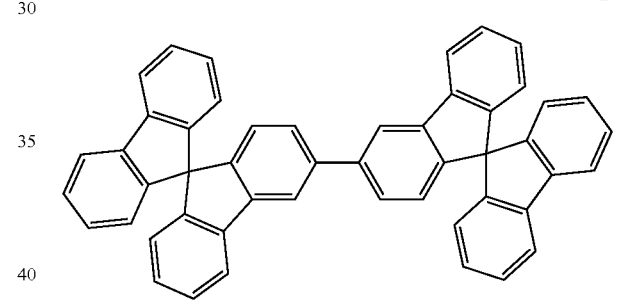

B-4

When at least two of $R_8$-$R_{11}$ in formula (III) both represent substituted carbon atoms, then the preferred benzene derivatives are those where $R_8$-$R_{10}$ are all substituted carbon atoms as shown in Formula (IIIb):

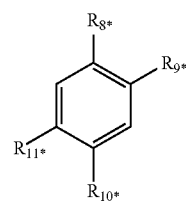

(IIIb)

where $R_{8*}$-$R_{10*}$ are tetrasubstituted or aromatic carbon atoms. In Formula (IIIb), $R_{11*}$ can be a hydrogen or a tetrasubstituted or aromatic carbon atom. Examples of suitable aromatic carbon atoms are carbon atoms belonging to substituted or unsubstituted phenyl, naphthyl, or fluorenyl ring systems.

Some illustrative examples of compounds according to Formula (IIIb) are:

Another class of suitable materials for the ETL1 is naphthalene derivatives. In order to have higher LUMO levels than anthracenes, useful naphthalene derivatives are those with no additional fused aromatic rings and whose substituents are attached to the core naphthyl nucleus via single bonds. Suitable naphthyl derivatives are according to Formula (IV):

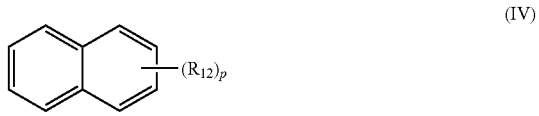

(IV)

wherein $R_{12}$ is an aromatic substituent and p is 2 to 8. Suitable aromatic substituents are substituted or unsubstituted phenyl, naphthyl, carbazolyl, phenanthryl or aromatic heterocycles such as pyridine. Preferred are phenyl groups with p=4.

An illustrative example of a compound according to Formula (IV) is:

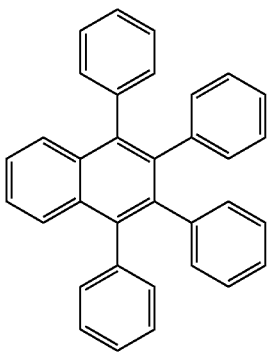

N-1

Yet another class of suitable materials for the ETL1 is cyclometallated organometallic complexes of iridium. Although such a compound is often used as a phosphorescent dopant in a LEL, in the present usage it should not emit any significant amount of light (less than 10% of the total amount of light from the device). When used as the single material in a layer in any OLED, such a compound generally emits weakly if at all, because of a phenomenon known as concentration quenching. Further, contact with an anthracene in the adjoining LEL or ETL2 favors energy transfer to the anthracene, tending to suppress any remaining emission. For iridium complexes that emit green or greater wavelength light, any emission from an ETL1 containing the iridium complex can easily be determined from examination of the EL light output. Suitable iridium complexes are according to Formula (V):

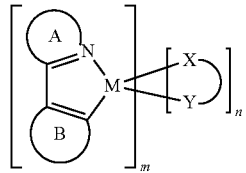

(V)

wherein:

M is iridium;

A is a substituted or unsubstituted heterocyclic ring containing at least one nitrogen atom;

B is a substituted or unsubstituted aromatic or heteroaromatic ring, or ring containing a vinyl or aromatic carbon bonded to M;

X—Y is an anionic bidentate ligand;

m is an integer from 1 to 3 and n in an integer from 0 to 2 such that m+n=3.

Compounds according to Formula (V) can be referred to as C,N- (or C^N-) cyclometallated complexes to indicate that the central metal atom is contained in a cyclic unit formed by bonding the metal atom to carbon and nitrogen atoms of one or more ligands. Examples of heterocyclic ring A in formula (V) include substituted or unsubstituted pyridine, quinoline, isoquinoline, pyrimidine, indole, indazole, thiazole, and oxazole rings. Examples of ring B in Formula (V) include substituted or unsubstituted phenyl, napthyl, thienyl, benzothienyl, furanyl rings. Ring B in formula (V) can also be a N-containing ring such as pyridine, with the proviso that this N-containing ring bonds to M through a C atom as shown in formula (V), and not through a N atom.

An example of a tris-C,N-cyclometallated complex according to formula (V) with m=3 and n=0 is tris(2-phenyl-pyridinato-N,$C^{2'}$-)iridium(III), (Ir(ppy)$_3$) shown below in stereodiagrams as facial (fac-) or meridional (mer-) isomers.

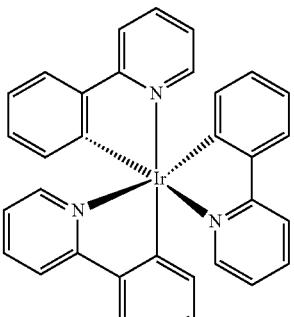

Fac

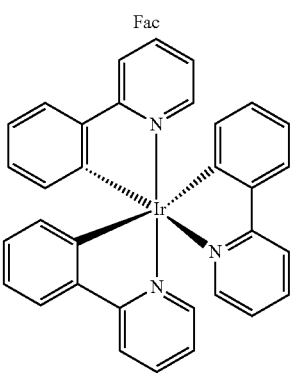

Mer

Additional examples of tris-C,N-cyclometallated iridium complexes according to formula (IC) are tris(2-phenyl-4-t-butylpyridinato-N,$C^{2'}$)iridium(III) (Ir(tbuppy)$_3$), tris(2-(4'-methylphenyl)pyridinato-N,$C^{2'}$)iridium(III), tris(3-phenyl-isoquinolinato-N,$C^{2'}$)iridium(III), tris(2-phenylquinolinato-N,$C^{2'}$)iridium(III), tris(1-(4'-methylphenyl)isoquinolinato-N,$C^{2'}$)iridium(III), tris(2-(4',6'-difluorophenyl)-pyridinato-N,$C^{2'}$)iridium(III), tris(2-((5'-phenyl)-phenyl)pyridinato-N,$C^{2'}$)iridium(III), tris(2-(2'-benzothienyl)pyridinato-N,$C^{3'}$)iridium(III), tris(2-phenyl-3,3'dimethylindolato-N,$C^{2'}$)iridium(III), and tris(1-phenyl-1H-indazolato-N,$C^{2'}$)iridium (III). Of these, Ir(ppy)$_3$ and Ir(tbuppy)$_3$ are particularly suitable for this invention Suitable iridium complexes also include compounds according to formula (V) wherein the monoanionic bidentate ligand X—Y is another C,N-cyclometallating ligand. Examples include bis(1-phenylisoquinolinato-N,$C^{2'}$)(2-phenylpyridinato-N,$C^{2'}$)iridium(III) and bis(2-phenylpyridinato-N,$C^{2'}$) (1-phenylisoquinolinato-N,$C^{2'}$)iridium(III). Suitable iridium complexes according to Formula (V) can, in addition to the C,N-cyclometallating ligand(s), also contain monoanionic bidentate ligand(s) X—Y that are not C,N-cyclometallating. Common examples are beta-diketonates such as acetylacetonate, and Schiff bases such as picolinate. Examples of such mixed ligand complexes according to formula (V) include bis(2-phenylpyridinato-N,$C^{2'}$)iridium(III)(acetylacetonate), bis(2-(2'-benzothienyl)pyridinato-N,$C^{3'}$)iridium(III)(acetylacetonate), and bis(2-(4,6'-difluorophenyl)-pyridinato-N,$C^{2'}$)iridium(III)(picolinate). It should be noted that iridium complexes that can be suitably used in the ETL1 should be selected according their LUMO levels from this broad list.

The devices of the invention contain an ETL2 which is located between the ETL1 and the cathode and which consists essentially of an anthracene. The function of this layer is to transport electrons. Ideally, this layer is located in direct contact to the cathode side of the ETL1. Suitable anthracenes for this usage are the same as those used as hosts in the LEL according to Formula (I). Although a mixture of anthracenes can be used, it is desirable for simplicity that a single anthracene is used. By "consists essentially of an anthracene", it is meant that this layer is composed of anthracene derivatives except that it can contain small and insignificant amounts of other materials such as not to materially affect the basic electrical properties that would characterize the layer in their absence. Desirably, the ETL2 is composed of at least 99% of a single anthracene derivative.

As noted above, the total thickness of the (optional ETL3)/ETL1/ETL2 unit can be in the range of 1-50 nm, preferably between 5 and 30 nm, so that the thickness of the ETL2 should be no more than about 49.5 nm, and desirably less than about 29.5 nm.

In some embodiments of the invention, there is an additional electron-injection layer (EIL) or layers present between the ETL2 and the cathode. The function of an EIL is to facilitate the injection of electrons from the cathode to the ETL2. Examples of suitable materials for the electron-injection layer include, but are not limited to, phenanthrolines (such as 4,7-diphenyl-1,10-phenanthroline (Bphen)), organic alkali metal or alkaline earth salts (such as lithium 8-hydroxyquinolate (LiQ), tris(quinolin-8-olato)aluminum(III) (Alq) or its derivatives), inorganic salts (such as LiF) or combinations thereof. The electron-injection layer can also be doped with metals such as lithium.

In one suitable embodiment the EL device emits white light, in which case the device typically includes one or more emitters of complementary color(s). To produce a white emitting device, ideally the device would comprise a layer with a blue fluorescent emitter together with proper proportions of a yellow emitting layer, or a combination of green and red emitting layers, suitable to make white emission. This invention can be used in so-called stacked device architecture, for example, as taught in U.S. Pat. No. 5,703,436 and U.S. Pat. No. 6,337,492. Embodiments of the current invention can be used in stacked devices that comprise solely fluorescent elements to produce white light. The blue LEL of the invention is a fluorescent layer. The white device can also include combinations of fluorescent emitting materials and phosphorescent emitting materials (sometimes referred to as hybrid OLED devices). For example, white emission can be produced by one or more hybrid blue fluorescent/red phosphorescent elements stacked in series with a green phosphorescent element using p/n junction connectors as disclosed in Tang et al. U.S. Pat. No. 6,936,961 B2. White-emitting OLEDs may be used with suitable color filters to produce colored light for the pixels of a display device.

In one desirable embodiment, the EL device is part of a display device. In another suitable embodiment, the EL device is part of an area lighting device. The EL device of the invention is useful in any device where stable light emission is desired such as a lamp or a component in a static or motion imaging device, such as a television, cell phone, DVD player, or computer monitor.

As used herein and throughout this application, chemical terms are generally as defined by the *Grant & Hackh's Chemical Dictionary*, Fifth Edition, McGraw-Hill Book Company. For the purpose of this invention, also included in the definition of a heterocyclic ring are those rings that include coordinate bonds. The definition of a coordinate or dative bond can be found in *Grant & Hackh's Chemical Dictionary*, pages 91 and 153. The definition of a ligand, including a multidentate ligand, can be found in *Grant & Hackh's Chemical Dictionary*, pages 337 and 176, respectively. Unless otherwise specifically stated, use of the term "substituted" or "substituent" refers to any group or atom other than hydrogen. Additionally, when the term "group" is used, it means that when a substituent group contains substitutable hydrogen, it is also intended to encompass not only the substituent's unsubstituted form, but also its form further substituted with any substituent group or groups as herein mentioned, so long as the substituent does not destroy properties necessary for device utility. If desired, the substituents can themselves be further substituted one or more times with the described substituent groups. The particular substituents used can be selected by those skilled in the art to attain desirable properties for a specific application and can include, for example, electron-withdrawing groups, electron-donating groups, and groups providing steric bulk. When a molecule can have two or more substituents, the substituents can be joined together to form a ring such as a fused ring unless otherwise provided.

Basic OLED information and description of the layer structure, material selection, and fabrication process for OLED devices can be found in the following along with the references cited therein: Chen, Shi, and Tang, "Recent Developments in Molecular Organic Electroluminescent Materials," *Macromol. Symp.* 125, 1 (1997); Hung and Chen, "Recent Progress of Molecular Organic Electroluminescent Materials and Devices," *Mat. Sci. and Eng.* R39, 143 (2002); H. Yersin, "Highly Efficient OLEDS with Phosphorescent Materials" (Wiley-VCH (Weinheim), 2007); K. Mullen and U. Scherf, "Organic Light Emitting Devices: Synthesis, Properties and Applications" (Wiley-VCH (Weinheim), 2006); J. Kalinowski, "Organic Light-Emitting Diodes: Principles, Characteristics and Processes (Optical Engineering)" (Dekker (NY), 2004); Z. Li and H. Meng, "Organic Light-Emitting Materials and Devices (Optical Science and Engineering)" (CRC/Taylor & Francis (Boca Raton), 2007) and J. Shinar, "Organic Light-Emitting Devices" (Springer (NY), 2002).

The present invention can be employed in many OLED configurations using small molecule materials, oligomeric materials, polymeric materials, or combinations thereof. These include from very simple structures having a single anode and cathode to more complex devices, such as passive matrix displays having orthogonal arrays of anodes and cathodes to form pixels, and active-matrix displays where each pixel is controlled independently, for example, with thin film transistors (TFTs). There are numerous configurations of the organic layers wherein the present invention is successfully practiced. For this invention, essential requirements are a cathode, an anode, a LEL and two ETLs.

One embodiment according to the present invention and especially useful for a small molecule device is shown in FIG. 1. OLED 100 contains a substrate 110, an anode 120, a hole-injecting layer 130, a hole-transporting layer 132, a light-emitting layer (LEL) 134, a thin first electron-transporting layer (ETL1) 135, a second electron-transporting layer (ETL2) 136, an electron-injecting layer (EIL) 138 and a cathode 140. The LEL 134 contains the inventive combination of anthracene host and styrylamine dopant, with thin layer 135 representing the inventive ETL1 with the material that has a less negative LUMO level than the anthracene in the ETL2, and ETL 136 representing the ETL2. Note that the substrate 110 can alternatively be located adjacent to the cathode 140, or the substrate can actually constitute the anode 120 or cathode 140. Also, the total combined thickness of the organic layers is preferably less than 500 nm.

In other embodiments, the EIL (138) can be subdivided into two or more sublayers, namely a first electron-injecting layer (EIL1) adjacent to the ETL2 (136) and a second electron-injecting layer (ETL2) located between the EIL1 and the cathode. In yet another embodiment, the HIL (130) can be subdivided into two or more sublayers, namely a first hole-injecting layer (HIL1) between the anode and the HTL, and a second hole-injecting layer (HIL2) between the HIL1 and the anode.

The anode 120 and cathode 140 of the OLED are connected to a voltage/current source 150, through electrical conductors 160. Applying an electrical potential difference between the anode 120 and cathode 140 such that the anode is at a more positive potential than the cathode operates the OLED. Holes are injected into the organic light-emitting structure from the anode 120. Electrons are injected from the cathode 140. Enhanced device stability can sometimes be achieved when the OLED is operated in an AC mode where, for some time period in a cycle, the potential bias is reversed and no current flows. An example of an AC driven OLED is described in U.S. Pat. No. 5,552,678.

For full color display, the pixelation of LELs can be needed. This pixelated deposition of LELs is achieved using shadow masks, integral shadow masks, U.S. Pat. No. 5,294,870, spatially defined thermal dye transfer from a donor sheet, U.S. Pat. Nos. 5,688,551, 5,851,709, and 6,066,357 and an inkjet method, U.S. Pat. No. 6,066,357.

OLEDs of this invention can employ various well-known optical effects in order to enhance their emissive properties if desired. These include optimizing layer thicknesses to yield improved light extraction, providing dielectric mirror structures, replacing reflective electrodes with light-absorbing electrodes, providing anti-glare or anti-reflection coatings over the display, providing a polarizing medium over the display, or providing colored, neutral density, or color-conversion filters over the display. Filters, polarizers, and anti-glare or anti-reflection coatings can be specifically provided over the OLED or as part of the OLED.

Embodiments of the invention can provide EL devices that have good luminance efficiency, good operational stability, excellent color and low drive voltages. Embodiments of the invention can be produced consistently and with high reproducibility to provide good power efficiency. They can have lower power consumption requirements and, when used with a battery, provide longer battery lifetimes.

The invention and its advantages are further illustrated by the specific examples that follow. The term "percentage" or "percent" and the symbol "%", applied to mixtures of materials, indicates the volume percent (or a thickness ratio as measured on a thin film thickness monitor) of a particular first or second compound relative to the total material in a layer of the invention. If more than one second compound is present, the total volume of the second compounds can also be expressed as a percentage of the total material in the layer of the invention.

EXPERIMENTAL EXAMPLES

The following table lists LUMO values for selected materials used in the following experiments. TPBI is 2,2',2''-(1,3,5-benzenetriyl)tris[1-phenyl-1H-benzimidazole]. Alq is tris(quinolin-8-olato)aluminum(III). BAlq' is bis(2-methylquinolin-8-olato)(2,6-diphenyl-phenolato)aluminum (III). CH-1 is bis(9,9'-spirobifluorene-2-yl) ketone.

TABLE A

Experimentally-determined (column 2) and calculated (column 3) LUMO energies for selected materials.

| Material | LUMO exp | LUMO calc |
|---|---|---|
| A-1 | −2.52 | −2.53 |
| A-2 | −2.44 | −2.46 |
| A-3 | −2.45 | −2.45 |
| A-4 | −2.45 | −2.46 |
| A-5 | −2.40 | −2.40 |
| CBP | −1.96 | −2.13 |
| CH-1 | −2.42 | −2.50 |
| Alq | −2.50 | −2.51 |
| N-1 | −1.95 | −2.03 |
| B-1 |  | −1.60 |
| B-2 (mCP) | −1.78 | −1.75 |
| NPB | −1.93 | −2.06 |
| B-3 |  | −2.21 |
| B-4 | −2.13 | −2.13 |
| Ir(ppy)$_3$ | −2.04 | −2.10 |
| Bphen | −2.40 | −2.29 |
| TPBI | −2.27 | −2.09 |
| BAlq' | −2.42 | −2.50 |
| F-1 | −2.57 | −2.61 |

Example Series 1

EL devices 1-1 to 1-36 were constructed in the following manner:

1. A glass substrate, coated with an approximately 25 nm layer of indium-tin oxide (ITO) as the anode, was sequentially ultrasonicated in a commercial detergent, rinsed in deionized water, dried and exposed to oxygen plasma for about 1 minute.
2. Over the ITO a 1 nm fluorocarbon (CF$_x$) hole injecting layer (HIL1) was deposited by plasma-assisted deposition of CHF$_3$ as described in U.S. Pat. No. 6,208,075.
3. A 10 nm layer of dipyrazino[2,3-f:2',3'-h]quinoxaline-2,3,6,7,10,11-hexacarbonitrile (HAT-CN) was then vacuum-deposited as a second hole-injection layer (HIL2).
4. Next, a hole transporting layer (HTL) of N,N'-di-1-naphthyl-N,N'-diphenyl-4,4'-diaminobiphenyl (NPB) was vacuum-deposited to a thickness of 75 nm.
5. A 25 nm light emitting layer including A-4 and 7% S-2 was then vacuum-deposited onto the HTL.
6. A thin first ETL (ETL1) was vacuum-deposited over the LEL with thickness and composition according to Table 1.
7. A second electron transporting layer (ETL2) of A-1 was vacuum-deposited over the ETL1. The thickness was adjusted so that the thickness of the ETL1 and the ETL2 together was always 20 nm.
8. A 10 nm thick electron injecting layer (EIL) of 4,7-diphenyl-1,10-phenanthroline (Bphen) was then vacuum-deposited over the ETL2. In Examples 1-28 to 1-33, this layer was additionally doped with 1.2% lithium.
9. Lithium fluoride (0.5 nm) was then vacuum-deposited over the EIL, followed by a 100 nm layer of aluminum, to form a bilayer cathode. In Examples 1-28 to 1-33, the LiF layer was omitted.

The above sequence completed the deposition of the EL device. The device, together with a desiccant, was then hermetically packaged in a dry glove box for protection against the ambient environment. The cells thus formed were tested for efficiency and color at an operating current density of 20 mA/cm$^2$ and the results are reported in the form of driving voltage (V), luminous yield (cd/A), external quantum efficiency (EQE), and 1931 CIE (Commission Internationale de l'Eclairage) coordinates. EQE is given as a percentage and is the ratio of photons of light that are emitted externally from the device to the number of electrons (or holes) injected into the OLED device. It was evaluated by measuring the EL emission perpendicular to the plane of the device and assuming that emission in other directions has a Lambertian distribution. The anthracene host is A-4 in all devices of series 1.

TABLE 1

Variation of the Thin First Electron Transporting Layer (ETL1) using an Anthracene as the Second Electron Transporting Layer (ETL2)

| Example | ETL2 | ETL1 | ETL1 Thickness (nm) | V | cd/A | $CIE_x$ | $CIE_y$ | EQE |
|---|---|---|---|---|---|---|---|---|
| 1-1 (Comp) | A-1 | None | None | 3.2 | 8.3 | 0.141 | 0.163 | 6.5 |
| 1-2 (Comp) | A-1 | N-1 | 0.5 | 3.1 | 8.20 | 0.141 | 0.163 | 6.4 |
| 1-3 (Inv) | A-1 | N-1 | 1.5 | 3.3 | 10.3 | 0.141 | 0.162 | 8.0 |
| 1-4 (Inv) | A-1 | N-1 | 2.5 | 3.5 | 12.2 | 0.141 | 0.166 | 9.4 |
| 1-5 (Inv) | A-1 | N-1 | 3.5 | 3.7 | 10.4 | 0.141 | 0.161 | 8.1 |
| 1-6 (Comp) | A-1 | N-1 | 5.0 | 4.5 | 7.7 | 0.141 | 0.160 | 6.0 |
| 1-7 (Inv) | A-1 | B-1 | 1.0 | 3.4 | 12.7 | 0.141 | 0.182 | 9.2 |
| 1-8 (Inv) | A-1 | B-1 | 1.5 | 3.4 | 10.2 | 0.141 | 0.182 | 9.4 |
| 1-9 (Inv) | A-1 | B-1 | 2.5 | 4.0 | 11.2 | 0.141 | 0.183 | 8.1 |
| 1-10 (Inv) | A-1 | mCP | 1.5 | 3.3 | 11.9 | 0.141 | 0.183 | 8.6 |
| 1-11 (Inv) | A-1 | mCp | 2.5 | 3.4 | 12.4 | 0.141 | 0.180 | 9.1 |
| 1-12 (Inv) | A-1 | mCp | 3.5 | 3.4 | 12.6 | 0.141 | 0.179 | 9.2 |
| 1-13 (Inv) | A-1 | NPB | 1.5 | 3.3 | 10.4 | 0.141 | 0.159 | 8.2 |
| 1-14 (Inv) | A-1 | B-3 | 1.5 | 3.2 | 11.0 | 0.142 | 0.165 | 8.5 |
| 1-15 (Inv) | A-1 | B-3 | 2.5 | 3.3 | 11.8 | 0.141 | 0.163 | 9.2 |
| 1-16 (Inv) | A-1 | B-3 | 3.5 | 3.4 | 11.4 | 0.141 | 0.163 | 8.9 |
| 1-17 (Comp) | A-1 | B-3 | 5.0 | 3.9 | 10.1 | 0.141 | 0.163 | 7.8 |
| 1-18 (Comp) | A-1 | B-4 | 0.5 | 3.1 | 8.8 | 0.141 | 0.177 | 6.4 |
| 1-19 (Inv) | A-1 | B-4 | 1.5 | 3.4 | 11.4 | 0.141 | 0.176 | 8.4 |
| 1-20 (Inv) | A-1 | B-4 | 2.5 | 3.6 | 11.0 | 0.141 | 0.177 | 8.1 |
| 1-21 (Comp) | A-1 | B-4 | 5.0 | 4.6 | 7.3 | 0.141 | 0.170 | 5.5 |
| 1-22 (Inv) | A-1 | Ir(ppy)$_3$ | 1.5 | 3.3 | 10.2 | 0.141 | 0.176 | 7.5 |
| 1-23 (Inv) | A-1 | Ir(ppy)$_3$ | 2.5 | 3.4 | 11.2 | 0.141 | 0.178 | 8.2 |
| 1-24 (Inv) | A-1 | Ir(ppy)$_3$ | 3.5 | 3.5 | 10.6 | 0.141 | 0.180 | 7.7 |
| 1-25 (Comp) | A-1 | Ir(ppy)$_3$ | 5.0 | 3.8 | 9.5 | 0.141 | 0.171 | 7.0 |
| 1-26 (Inv) | A-1 | N-1 + 2% A-4 | 2.5 | 3.5 | 12.0 | 0.141 | 0.178 | 8.8 |
| 1-27 (Inv) | A-1 | N-1 + 10% A-4 | 2.5 | 3.4 | 11.8 | 0.141 | 0.180 | 8.6 |
| 1-28 (Comp) | A-1 | None | -None | 3.3 | 9.9 | 0.141 | 0.178 | 7.3 |
| 1-29 (Inv) | A-1 | N-1 | 2.5 | 3.5 | 11.3 | 0.141 | 0.175 | 8.3 |
| 1-30 (Inv) | A-1 | N-1 | 3.5 | 3.7 | 10.8 | 0.141 | 0.173 | 8.1 |
| 1-31 (Comp) | A-1 | N-1 | 5.0 | 4.1 | 8.86 | 0.141 | 0.174 | 6.6 |
| 1-32 (Inv) | A-1 | mCP | 2.5 | 3.4 | 11.8 | 0.141 | 0.175 | 8.7 |
| 1-33 (Comp) | A-1 | mCP | 5.0 | 4.2 | 8.7 | 0.141 | 0.175 | 6.5 |
| 1-34 (Comp) | A-1 | TPBI | 2.5 | 3.9 | 8.7 | 0.141 | 0.178 | 6.4 |
| 1-35 (Comp) | A-1 | TPBI | 5.0 | 4.3 | 7.8 | 0.141 | 0.178 | 5.7 |
| 1-36 (Comp) | A-1 | TPBI | 7.5 | 4.3 | 7.5 | 0.141 | 0.181 | 5.5 |

In Table 1, comparison of inventive examples 1-3 to 1-5 with comparative examples 1-2 or 1-6, all with a material with a less negative LUMO level compared to the anthracene in the ETL2, shows that the ETL1 adjacent to the LEL should have a thickness range of greater than 0.5 nm but less than 5.0 nm in order to show high efficiency and low drive voltage. Examples 1-7 to 1-27 show that the same improvement in efficiency occurs with other classes of materials with a less negative LUMO level than the anthracene of the ETL2 in the same thickness range. Inventive examples 1-26 and 1-27 demonstrate that the ETL1 can be doped with a small amount of an anthracene and maintain high efficiency. Examples 1-29, 1-30, and 1-32 show that further doping the EIL with metallic lithium, while omitting the LiF, retains the high efficiency.

For comparative Examples 1-34 to 1-36, the results show that use of TPBI in the thin first ETL adversely affects device performance. The LUMO energy of TPBI is less negative than the LUMO energy of anthracene A-1 used in the ETL2 as shown in Table A. Thus, the bather is created for electron injection from the ETL2 into a layer of TPBI. For experimentally determined LUMO levels this barrier is 0.25 eV, which is too small to provide the improved device performance. It is desirable for achievement of the inventive efficiency improvement that the difference in LUMO levels of materials used in the ETL1 and the ETL2 be greater than 0.35 eV.

Example Series 2

EL devices 2-1 to 2-9 were constructed in the same manner as Example Series 1 except that the material in the LEL was varied according to Table 2. CBP is 4,4'-bis(N-carbazolyl)-1,1'-biphenyl. Devices were aged electrically at room temperature at a constant current density of 80 mA/cm$^2$ (DC mode). The lifetime ($T_{50}$), or operational stability, of an OLED device is defined as the number of hours required for the luminance at 80 mA/cm$^2$ to drop to half the luminance of the fresh device.

TABLE 2

ETL1 Variations with Anthracene and Non-Anthracene LEL Host and Anthracene A-1 in ETL2

| Example | LEL host | ETL1 | ETL1 Thickness (nm) | V | cd/A | EQE | $T_{50}$ at 80 mA/cm$^2$ |
|---|---|---|---|---|---|---|---|
| 1-1 (Comp) | A-1 | None | None | 3.2 | 8.3 | 6.5 | 165 |
| 1-2 (Comp) | A-1 | N-1 | 0.5 | 3.1 | 8.20 | 6.4 | 175 |

TABLE 2-continued

ETL1 Variations with Anthracene and Non-Anthracene
LEL Host and Anthracene A-1 in ETL2

| Example | LEL host | ETL1 | ETL1 Thickness (nm) | V | cd/A | EQE | $T_{50}$ at 80 mA/cm² |
|---|---|---|---|---|---|---|---|
| 1-3 (Inv) | A-1 | N-1 | 1.5 | 3.3 | 10.3 | 8.0 | 147 |
| 1-4 (Inv) | A-1 | N-1 | 2.5 | 3.5 | 12.2 | 9.4 | 111 |
| 1-5 (Inv) | A-1 | N-1 | 3.5 | 3.7 | 10.4 | 8.1 | 74 |
| 1-6 (Comp) | A-1 | N-1 | 5.0 | 4.5 | 7.7 | 6.0 | 102 |
| 1-10 (Inv) | A-1 | mCp | 1.5 | 3.3 | 11.9 | 8.6 | 162 |
| 1-11 (Inv) | A-1 | mCp | 2.5 | 3.4 | 12.4 | 9.1 | 168 |
| 1-12 (Inv) | A-1 | mCp | 3.5 | 3.4 | 12.6 | 9.2 | 125 |
| 2-1 (Comp) | CBP | None | None | 5.0 | 3.5 | 2.7 | 27 |
| 2-2 (Comp) | CBP | N-1 | 1.5 | 4.9 | 4.7 | 3.4 | 24 |
| 2-3 (Comp) | CBP | N-1 | 2.5 | 5.2 | 4.9 | 3.6 | 18 |
| 2-4 (Comp) | CBP | N-1 | 3.5 | 5.4 | 4.6 | 3.4 | 16 |
| 2-5 (Comp) | CBP | N-1 | 5.0 | 5.8 | 4.1 | 3.0 | 23 |
| 2-6 (Comp) | CBP | mCp | 1.5 | 5.2 | 4.2 | 3.1 | 25 |
| 2-7 (Comp) | CBP | mCp | 2.5 | 5.3 | 3.8 | 2.8 | 20 |
| 2-8 (Comp) | CBP | mCp | 3.5 | 5.5 | 3.1 | 2.3 | 12 |
| 2-9 (Comp) | CBP | mCp | 5.0 | 5.9 | 2.0 | 1.6 | 12 |

In Table 2, comparative examples 2-1 to 2-9 demonstrate that using a host that is not an anthracene in the LEL with a blue styrylamine emitter causes low efficiency and significantly degrades stability. The efficiency can be improved to a small degree by the addition of an ETL1 according to the invention but overall external quantum efficiency remains much less than that of the blue fluorescent devices with an anthracene in the LEL.

Example Series 3

EL devices 3-1 to 3-27 were constructed in the same manner as Example Series 1 except that the material in the ETL2 was varied according to Table 3. In examples 3-11 to 3-27, the thickness was adjusted so that the thickness of the ETL1 and ETL2 together was always 30 nm and the EIL of Bphen of step 8 was omitted. F-1 and BAlq' have the following structures:

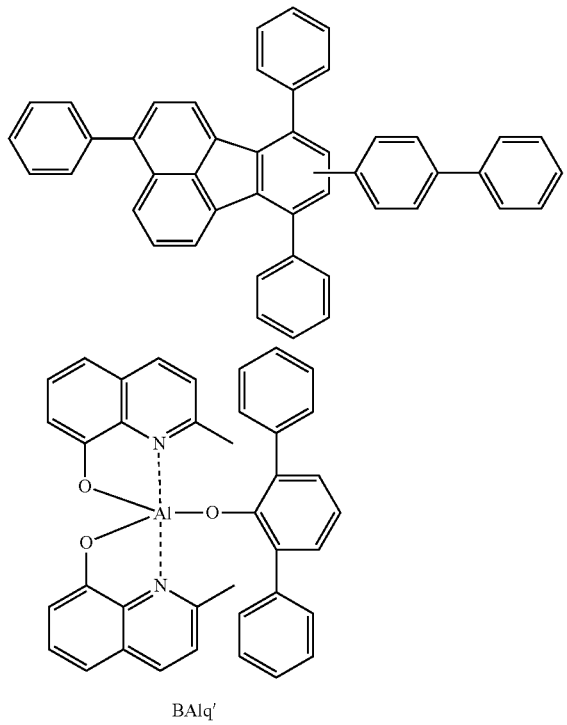

F-1

BAlq'

TABLE 3

ETL1 Variations with Anthracene
LEL Host and Non-Anthracene ETL2

| Example | ETL1 | ETL1 Thickness (nm) | ETL2 | V | cd/A | $CIE_x$ | $CIE_y$ | EQE |
|---|---|---|---|---|---|---|---|---|
| 3-1 (Comp) | None | None | F-1 | 3.4 | 9.6 | 0.141 | 0.169 | 7.2 |
| 3-2 (Comp) | N-1 | 0.5 | F-1 | 3.5 | 10.2 | 0.141 | 0.169 | 7.8 |
| 3-3 (Comp) | N-1 | 1.5 | F-1 | 3.6 | 10.2 | 0.141 | 0.167 | 7.8 |
| 3-4 (Comp) | N-1 | 2.5 | F-1 | 3.8 | 9.4 | 0.141 | 0.167 | 7.2 |
| 3-5 (Comp) | N-1 | 3.5 | F-1 | 4.1 | 8.2 | 0.141 | 0.166 | 6.3 |
| 3-6 (Comp) | N-1 | 5.0 | F-1 | 4.6 | 6.9 | 0.141 | 0.165 | 5.3 |
| 3-7 (Comp) | None | None | A-1 + Bphen (1:1) | 4.5 | 5.8 | 0.141 | 0.176 | 4.3 |
| 3-8 (Comp) | mCp | 1.5 | A-1 + Bphen (1:1) | 4.4 | 5.6 | 0.141 | 0.167 | 4.3 |
| 3-9 (Comp) | mCp | 2.5 | A-1 + Bphen (1:1) | 4.5 | 5.3 | 0.141 | 0.166 | 4.0 |
| 3-10 (Comp) | mCp | 5.0 | A-1 + Bphen (1:1) | 4.9 | 4.4 | 0.141 | 0.163 | 3.4 |
| 3-11 (Comp) | None | None | Alq | 5.9 | 7.3 | 0.144 | 0.190 | 5.1 |
| 3-12 (Comp) | N-1 | 2.5 | Alq | 6.1 | 7.0 | 0.143 | 0.190 | 5.0 |
| 3-13 (Comp) | N-1 | 5.0 | Alq | 6.7 | 6.2 | 0.142 | 0.178 | 4.5 |
| 3-14 (Comp) | None | None | Alq | 5.9 | 7.7 | 0.144 | 0.192 | 5.3 |

TABLE 3-continued

ETL1 Variations with Anthracene LEL Host and Non-Anthracene ETL2

| Example | ETL1 | ETL1 Thickness (nm) | ETL2 | V | cd/A | CIE$_x$ | CIE$_y$ | EQE |
|---|---|---|---|---|---|---|---|---|
| 3-15 (Comp) | mCp | 0.5 | Alq | 5.8 | 7.0 | 0.144 | 0.195 | 4.8 |
| 3-16 (Comp) | mCp | 1.5 | Alq | 6.1 | 7.2 | 0.144 | 0.194 | 4.9 |
| 3-17 (Comp) | mCp | 2.5 | Alq | 6.2 | 6.9 | 0.144 | 0.191 | 4.8 |
| 3-18 (Comp) | mCp | 5.0 | Alq | 7.1 | 4.7 | 0.150 | 0.206 | 3.0 |
| 3-19 (Comp) | mCp | 7.5 | Alq | 8.2 | 2.0 | 0.205 | 0.334 | 0.9 |
| 3-20 (Comp) | None | None | BAlq' | 9.9 | 4.2 | 0.141 | 0.170 | 3.2 |
| 3-21 (Comp) | mCp | 0.5 | BAlq' | 10.0 | 4.0 | 0.141 | 0.171 | 3.0 |
| 3-22 (Comp) | mCp | 1.5 | BAlq' | 10.1 | 3.4 | 0.141 | 0.171 | 2.6 |
| 3-23 (Comp) | mCp | 2.5 | BAlq' | 9.9 | 3.2 | 0.141 | 0.170 | 2.4 |
| 3-24 (Comp) | mCp | 5.0 | BAlq' | 10.1 | 2.3 | 0.142 | 0.173 | 1.7 |
| 3-25 (Comp) | mCp | 7.5 | BAlq' | 10.3 | 1.8 | 0.143 | 0.178 | 1.3 |
| 3-26 (Comp) | None | None | TPBI | 6.1 | 7.3 | 0.141 | 0.178 | 5.4 |
| 3-27 (Comp) | mCp | 5.0 | TPBI | 6.9 | 5.7 | 0.141 | 0.170 | 4.3 |

The results in Table 3 confirm that when the ETL2 is not an anthracene or even if the anthracene is mixed with a significant amount of another non-anthracene material, there is little or no increase in efficiency, or even a decrease in efficiency when a thin layer (ETL1) of a less negative LUMO material is placed between the LEL and the ETL2.

Example Series 4

EL devices 4-1 to 4-20 were constructed in the same manner as Example Series 1 except that the light-emitting material in the LEL was according to Table 4. The LEL host is A-4 and ETL2 is A-1. The comparative emitters have the following structures:

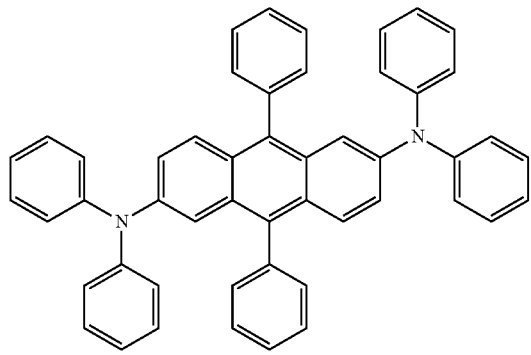

CE-1

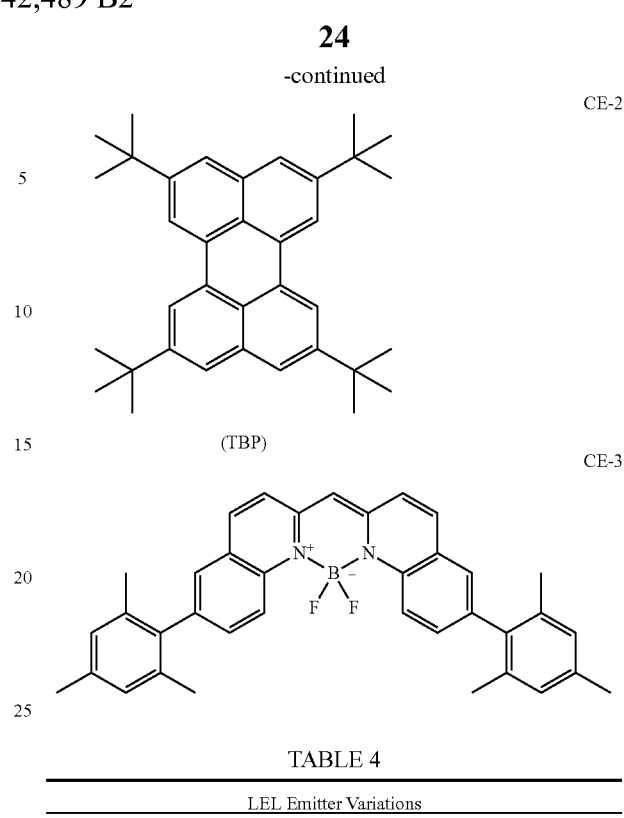

CE-2 (TBP)

CE-3

TABLE 4

LEL Emitter Variations

| Example | ETL1 | ETL1 Thickness (nm) | LEL | V | cd/A | CIE$_x$ | CIE$_y$ | EQE |
|---|---|---|---|---|---|---|---|---|
| 4-1 (Comp) | None | None | 6% CE-1 | 3.6 | 28.5 | 0.274 | 0.654 | 7.8 |
| 4-2 (Comp) | N-1 | 1.5 | 6% CE-1 | 3.6 | 28.1 | 0.275 | 0.654 | 7.7 |
| 4-3 (Comp) | N-1 | 2.5 | 6% CE-1 | 3.8 | 31.4 | 0.272 | 0.657 | 8.6 |
| 4-4 (Comp) | N-1 | 3.5 | 6% CE-1 | 4.4 | 29.9 | 0.272 | 0.657 | 8.1 |
| 4-5 (Comp) | N-1 | 5.0 | 6% CE-1 | 5.8 | 23.7 | 0.271 | 0.657 | 6.5 |
| 4-6 (Comp) | None | None | 1% CE-2 | 3.2 | 6.9 | 0.132 | 0.195 | 4.9 |
| 4-7 (Comp) | N-1 | 0.5 | 1% CE-2 | 3.3 | 6.6 | 0.132 | 0.194 | 4.7 |
| 4-8 (Comp) | N-1 | 1.5 | 1% CE-2 | 3.4 | 7.3 | 0.132 | 0.194 | 5.2 |
| 4-9 (Comp) | N-1 | 2.5 | 1% CE-2 | 3.6 | 7.3 | 0.132 | 0.195 | 5.2 |
| 4-10 (Comp) | N-1 | 3.5 | 1% CE-2 | 5.1 | 4.1 | 0.132 | 0.186 | 3.0 |
| 4-11 (Comp) | N-1 | 5.0 | 1% CE-2 | 5.1 | 4.1 | 0.132 | 0.186 | 5.0 |
| 4-12 (Comp) | None | None | 1.5% CE-3 | 5.9 | 3.5 | 0.139 | 0.121 | 5.7 |
| 4-13 (Comp) | CBP | 1.5 | 1.5% CE-3 | 5.7 | 3.7 | 0.140 | 0.116 | 5.7 |
| 4-14 (Comp) | CBP | 2.5 | 1.5% CE-3 | 6.1 | 3.7 | 0.138 | 0.117 | 6.1 |
| 4-15 (Comp) | CBP | 3.5 | 1.5% CE-3 | 6.0 | 3.8 | 0.138 | 0.114 | 6.1 |
| 4-16 (Comp) | CBP | 5.0 | 1.5% CE-3 | 5.5 | 4.0 | 0.139 | 0.112 | 5.7 |
| 4-17 (Comp) | NPB | 1.5 | 1.5% CE-3 | 6.1 | 3.8 | 0.139 | 0.119 | 6.0 |
| 4-18 (Comp) | NPB | 2.5 | 1.5% CE-3 | 5.3 | 4.2 | 0.138 | 0.115 | 5.4 |
| 4-19 (Comp) | NPB | 3.5 | 1.5% CE-3 | 3.1 | 5.4 | 0.138 | 0.111 | 3.2 |
| 4-20 (Comp) | NPB | 5.0 | 1.5% CE-3 | 0.8 | 7.2 | 0.139 | 0.107 | 0.9 |

The results in Table 4 confirm that when the emitter in the LEL is not a styrylamine, the addition of a thin electron-transporting layer with a less negative LUMO than the anthracene in the second ETL provides little or no improvement in efficiency.

Example Series 5

EL devices 5-1 to 5-6 were constructed in the following manner:
1. A glass substrate, coated with an approximately 25 nm layer of indium-tin oxide (ITO) as the anode, was sequentially ultrasonicated in a commercial detergent, rinsed in deionized water, dried and exposed to an oxygen plasma for about 1 minute.
2. Over the ITO a 1 nm fluorocarbon ($CF_x$) hole injecting layer (HIL2) was deposited by plasma-assisted polymerization of $CHF_3$ as described in U.S. Pat. No. 6,208,075.
3. A 10 nm layer of dipyrazino[2,3-f:2',3'-h]quinoxaline-2,3,6,7,10,11-hexacarbonitrile (HAT-CN) was then vacuum-deposited as a first hole-injection layer (HIL1).
4. Next, a hole transporting layer (HTL) of N,N'-di-1-naphthyl-N,N'-diphenyl-4,4'-diaminobiphenyl (NPB) was vacuum-deposited to a thickness of 75 nm.
5. A 25 nm light emitting layer including A-4 as host and 7% S-1 was then vacuum-deposited onto the HTL.
6. An additional 10 nm anthracene layer of A-1 (ETL3) was vacuum-deposited over the LEL.
7. A thin first ETL (ETL1) was vacuum-deposited over the LEL with thickness and composition according to Table 5.
8. A second electron transporting layer (ETL2) of A-1 was vacuum-deposited over the ETL1. The thickness was adjusted so that the thickness of the ETL1 and ETL2 together was always 10 nm.
9. A 10 nm thick electron injecting layer (EIL) of 4,7-diphenyl-1,10-phenanthroline (Bphen) was then vacuum-deposited over the ETL2.
10. Lithium fluoride (0.5 nm) was then vacuum-deposited over the EIL, followed by a 100 nm layer of aluminum, to form a bilayer cathode The above sequence completed the deposition of the EL device. The device, together with a desiccant, was then hermetically packaged in a dry glove box for protection against the ambient environment. The cells thus formed were tested as describes for Example series 1.

TABLE 5

Additional Anthracene Layer between the LEL and the ETL1

| Example | ETL1 | ETL1 Thickness (nm) | V | cd/A | $CIE_x$ | $CIE_y$ | EQE |
|---|---|---|---|---|---|---|---|
| 5-1 (Comp) | None | none | 3.2 | 9.3 | 0.141 | 0.171 | 7.0 |
| 5-2 (Inv) | CBP | 2.5 | 3.3 | 10.4 | 0.141 | 0.167 | 7.9 |
| 5-3 (Inv) | NPB | 1.5 | 3.2 | 10.3 | 0.141 | 0.168 | 7.9 |
| 5-4 (Inv) | N-1 | 2.5 | 3.6 | 11.2 | 0.141 | 0.175 | 8.3 |
| 5-5 (Inv) | N-1 + 5% A-1 | 2.5 | 3.5 | 10.9 | 0.141 | 0.176 | 8.0 |
| 5-6 (Inv) | N-1 + 10% A-1 | 2.5 | 3.4 | 10.7 | 0.141 | 0.175 | 8.0 |

The results in Table 5 confirm that the ETL1 need not be directly adjacent to the LEL to provide increased efficiency but can be separated from it by another layer (ETL3) which consists essentially of an anthracene. Examples 5-5 and 5-6 show that the ETL1, placed at a distance from the LEL as described above, can be doped with an anthracene and still provide the improvement in device efficiency.

Example Series 6

EL devices 6-1 to 6-8 were constructed in the following manner:
1. A glass substrate, coated with an approximately 25 nm layer of indium-tin oxide (ITO) as the anode, was sequentially ultrasonicated in a commercial detergent, rinsed in deionized water, dried and exposed to an oxygen plasma for about 1 minute.
2. Over the ITO a 1 nm fluorocarbon ($CF_x$) hole injecting layer (HIL2) was deposited by plasma-assisted polymerization of $CHF_3$ as described in U.S. Pat. No. 6,208,075.
3. A 10 nm layer of dipyrazino[2,3-f:2',3'-h]quinoxaline-2,3,6,7,10,11-hexacarbonitrile (HAT-CN) was then vacuum-deposited as a first hole-injection layer (HIL1).
4. Next, a hole transporting layer (HTL) of N,N'-di-1-naphthyl-N,N'-diphenyl-4,4'-diaminobiphenyl (NPB) was vacuum-deposited to a thickness of 105 nm.
5. In examples 6-1 to 6-5, a 35 nm light emitting layer (LEL) including BAlq' as host and 8% tris(1-phenylisoquinolinato-$N,C^{2'}$)iridium(III) ($Ir(1-piq)_3$) as a phosphorescent emitter was then vacuum-deposited onto the HTL. In examples 6-6 to 6-8, the LEL consisted of a mixture of CH-1 host, 25% NPB as cohost, and 6% $Ir(1-piq)_3$.
6. A thin first ETL (ETL1) was vacuum-deposited over the LEL with thickness and composition according to Table 6.
7. An electron transporting layer (ETL2) of A-1 was vacuum-deposited over the ETL1. The thickness was adjusted so the thickness of the ETL1 and ETL2 together was always 40 nm.
8. A 10 nm thick electron injecting layer (EIL) of Bphen was then vacuum-deposited over the ETL2.
9. Lithium fluoride (0.5 nm) was then vacuum-deposited over the EIL, followed by a 100 nm layer of aluminum, to form a bilayer cathode.

The above sequence completed the deposition of the EL device. The device, together with a desiccant, was then hermetically packaged in a dry glove box for protection against the ambient environment. The cells thus formed were tested for efficiency and color at an operating current density of 1 $mA/cm^2$. Devices were aged electrically at room temperature at current density of 40 $mA/cm^2$ in DC mode. The lifetime ($T_{50}$), or operational stability, of these OLED devices is defined as the number of hours required for the luminance at 40 $mA/cm^2$ to drop to half the luminance of the fresh device.

The structure of CH-1 is:

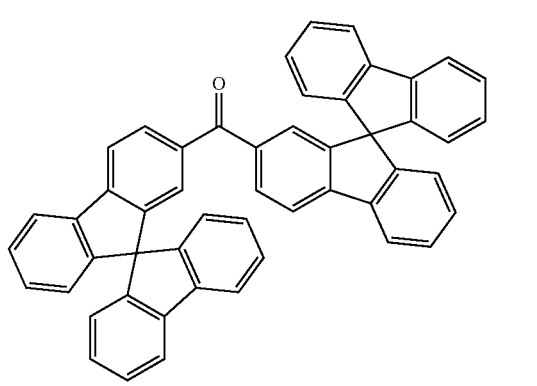

CH-1

TABLE 6a

Phosphorescent LEL Evaluation

| Example | ETL1 | ETL1 Thickness (nm) | V | cd/A | $CIE_x$ | $CIE_y$ | EQE |
|---|---|---|---|---|---|---|---|
| 6-1 (Comp) | None | None | 3.6 | 10.5 | 0.68 | 0.32 | 13.6 |
| 6-2 (Comp) | N-1 | 1.5 | 3.8 | 10.6 | 0.68 | 0.32 | 13.9 |
| 6-3 (Comp) | N-1 | 2.5 | 4.0 | 10.6 | 0.68 | 0.32 | 13.8 |
| 6-4 (Comp) | N-1 | 3.5 | 4.6 | 9.8 | 0.68 | 0.32 | 12.7 |
| 6-5 (Comp) | N-1 | 5.0 | 5.9 | 8.5 | 0.68 | 0.32 | 11.0 |
| 6-6 (Comp) | None | None | 2.6 | 10.3 | 0.68 | 0.32 | 12.9 |
| 6-7 (Comp) | N-1 | 1.5 | 2.6 | 10.8 | 0.68 | 0.32 | 13.7 |
| 6-8 (Comp) | N-1 | 3.5 | 2.8 | 11.2 | 0.68 | 0.32 | 14.1 |

TABLE 6b

Phosphorescent LEL Stability

| Example | ETL1 | ETL1 Thickness (nm) | $T_{50}$ at 40 $mA/cm^2$ |
|---|---|---|---|
| 6-1 (Comp) | None | None | 721 |
| 6-2 (Comp) | N-1 | 1.5 | 390 |
| 6-3 (Comp) | N-1 | 2.5 | 123 |
| 6-4 (Comp) | N-1 | 3.5 | 194 |
| 6-5 (Comp) | N-1 | 5.0 | n.a. |
| 6-6 (Comp) | None | None | 1202 |
| 6-7 (Comp) | N-1 | 1.5 | 942 |
| 6-8 (Comp) | N-1 | 3.5 | 868 |

The results in Tables 6β and 6β indicate that the addition of an ETL1 to an OLED with a phosphorescent LEL provides little or no increase in efficiency even if the ETL1 has a material with a less negative LUMO than the material of the ETL2. Moreover, adverse effects on device stability are observed.

The invention has been described in detail with particular reference to certain preferred embodiments thereof, but it will be understood that variations and modifications can be effected within the spirit and scope of the invention.

PARTS LIST

| | |
|---|---|
| 100 | OLED |
| 110 | Substrate |
| 120 | Anode |
| 130 | Hole-Injecting layer (HIL) |
| 132 | Hole-Transporting layer (HTL) |
| 134 | Light-Emitting layer (LEL) |
| 135 | Thin First Electron-Transporting Layer (ETL1) |
| 136 | Second Electron-Transporting layer (ETL2) |
| 138 | Electron-Injecting layer (EIL) |
| 140 | Cathode |
| 150 | Voltage/Current Source |
| 160 | Electrical Connectors |

The invention claimed is:

1. An OLED device comprising:
   an anode;
   a cathode;
   a light-emitting layer located therebetween, said light-emitting layer comprising an anthracene host and a styrylamine blue light-emitting compound; and
   located between the said light-emitting layer and the cathode, a first electron-transporting layer that is greater than 0.5 nm and less than 5 nm thick and a second electron-transporting layer consisting essentially of an anthracene located between the first electron-transporting layer and the cathode;
   wherein the first electron-transporting layer includes a compound with a less negative LUMO value than the anthracene in the second electron-transporting layer.

2. The OLED device of claim 1 wherein the difference in LUMO value between the compound in the first electron-transporting layer and the anthracene in the second electron-transporting layer is at least 0.26 eV.

3. The OLED device of claim 1 wherein the difference in LUMO value between the compound in the first electron-transporting layer and the anthracene in the second electron-transporting layer exceeds 0.35 eV.

4. The OLED device of claim 1 wherein the first electron-transporting layer is located in direct contact with the light-emitting layer.

5. The OLED device of claim 1 wherein the first electron-transporting layer additionally contains an anthracene.

6. The OLED device of claim 1 wherein there is an additional layer consisting essentially of an anthracene located between the first electron-transporting layer and the light-emitting layer.

7. The OLED device of claim 1 wherein the compound in the first electron-transporting layer is selected from benzene derivatives according to Formula (III):

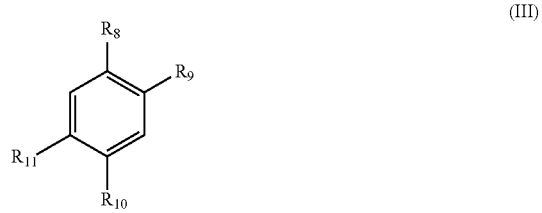

(III)

wherein:
   at least two of $R_8$-$R_{11}$ both represent hydrogen or substituted carbon, silicon or nitrogen atoms with the proviso that no more than two of $R_8$-$R_{11}$ are hydrogen.

8. The OLED device of claim 7 wherein the benzene derivative is selected from the group consisting of

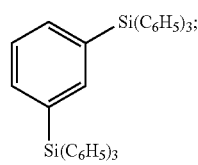

B-1

B-2

(mCP)

B-3

; or

B-4

9. The OLED device of claim 1 wherein the compound in the first electron-transporting layer is a naphthalene derivative according to Formula (IV)

$$(R_{12})_p$$

wherein:

$R_{12}$ is an aromatic substituent and p is 2 to 8.

10. The OLED device of claim 9 wherein the naphthalene derivative is:

N-1

11. The OLED device of claim 1 wherein the compound in the first electron-transporting layer is an iridium derivative according to Formula (V):

$$(V)$$

wherein:

M is iridium;

A is a substituted or unsubstituted heterocyclic ring containing at least one nitrogen atom;

B is a substituted or unsubstituted aromatic or heteroaromatic ring, or ring containing a vinyl or aromatic carbon bonded to M;

X-Y is an anionic bidentate ligand; m is an integer from 1 to 3 and n in an integer from 0 to 2 such that m+n=3.

12. The OLED device of claim 11 wherein the iridium derivative is tris(2-phenyl-pyridinato-N,$C^2$-)iridium (III).

13. The OLED device of claim 1 wherein the anthracene in the second electron-transporting layer is according to formula (I):

$$(I)$$

wherein:

$R^1$ and $R^6$ each independently represent an aryl group having 6-24 carbon atoms; $R^2$-$R^5$ and $R^7$-$R^{10}$ are each independently chosen from hydrogen, alkyl groups from 1-24 carbon atoms, or aromatic groups from 5-24 carbon atoms.

14. The OLED device of claim 6 wherein the anthracene in the additional layer is according to formula (I):

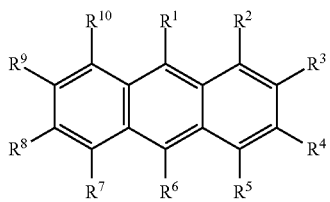

wherein:

$R^1$ and $R^6$ each independently represent an aryl group having 6-24 carbon atoms; $R^2$-$R^5$ and $R^7$-$R^{10}$ are each independently chosen from hydrogen, alkyl groups from 1-24 carbon atoms, or aromatic groups from 5-24 carbon atoms.

15. The OLED device of claim 14 wherein the anthracenes in both the second electron-transporting layer and the additional layer are the same.

16. The OLED device of claim 1 wherein the anthracene host in the light-emitting layer is according to Formula (I):

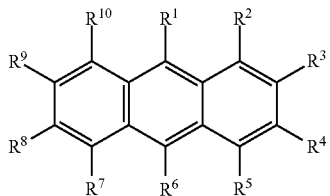

wherein:

$R^1$ and $R^6$ each independently represent an aryl group having 6-24 carbon atoms; $R^2$-$R^5$ and $R^7$-$R^{10}$ are each independently chosen from hydrogen, alkyl groups from 1-24 carbon atoms, or aromatic groups from 5-24 carbon atoms.

17. The OLED device of claim 1 wherein the styrylamine blue light-emitting compound is according to formula (II):

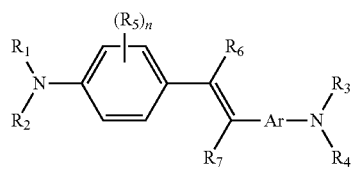

wherein:

$R_1$, $R_2$, $R_3$ and $R_4$ are independently chosen aryl groups of 6-24 nucleus carbon atoms with the proviso that $R_1$ and $R_2$ or $R_3$ and $R_4$ can be joined together to form a ring; or alkyl groups of 1-6 carbon atoms;

$R_5$ is selected from alkyl and aryl groups;

n is 0-4;

$R_6$ and $R_7$ are independently selected from hydrogen, alkyl or aryl groups; and Ar represents a substituted or unsubstituted aryl group of 6 to 30 nucleus carbon atoms.

* * * * *